United States Patent
Wang et al.

(10) Patent No.: US 7,109,047 B1
(45) Date of Patent: Sep. 19, 2006

(54) METHOD AND DEVICE FOR ANALYZING CIRCUITS

(75) Inventors: Yong V. Wang, Fort Collins, CO (US); Alex McHardy, Pueblo, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 41 days.

(21) Appl. No.: 11/090,466

(22) Filed: Mar. 25, 2005

Related U.S. Application Data

(60) Provisional application No. 60/558,406, filed on Apr. 1, 2004.

(51) Int. Cl.
*H01L 31/26* (2006.01)

(52) U.S. Cl. .................. 438/14; 716/2; 716/5; 716/6; 716/10

(58) Field of Classification Search .............. 438/14; 716/2, 5, 6, 10
See application file for complete search history.

(56) References Cited

U.S. PATENT DOCUMENTS

| | | | | |
|---|---|---|---|---|
| 5,999,726 | A | * | 12/1999 | Ho .............................. 716/11 |
| 6,013,536 | A | * | 1/2000 | Nowak et al. ................ 438/17 |
| 6,266,802 | B1 | * | 7/2001 | Malm et al. .................. 716/12 |
| 6,887,791 | B1 | * | 5/2005 | Jung .......................... 438/689 |

* cited by examiner

*Primary Examiner*—Sara Crane

(57) ABSTRACT

A method of analyzing a circuit comprising a plurality of interconnects is disclosed herein. The method may comprise analyzing at least one electrical property associated with a first interconnect, wherein the first interconnect has at least one first physical dimension. The electrical property may then be stored. A second interconnect having the at least one first physical dimension may then be located and the at least one electrical property is applied to the second interconnect.

21 Claims, 5 Drawing Sheets

| INTERCONNECT TYPE | HEIGHT | LENGTH | WIDTH | OTHER PARAMETERS | RLC EQUIVALENT CIRCUIT |
|---|---|---|---|---|---|
| 1 | A | B | C | D | X |
| 2 | A | B | E | D | Y |
| 3 | A | B | F | D | Z |
| ⋮ | ⋮ | ⋮ | ⋮ | ⋮ | ⋮ |

*FIG. 4*

METHOD AND DEVICE FOR ANALYZING CIRCUITS

This application claims the benefit of U.S. Provisional Application No. 60/558,406, filed Apr. 1, 2004, for METHOD AND DEVICE FOR ANALYZING CIRCUITS of Yong Wang et al., which is hereby incorporated by reference for all that is disclosed therein.

BACKGROUND

Integrated circuits are becoming increasingly complex. These complex integrated circuits may include thousands or millions of interconnects that serve to connect thousands or millions of electronic components located on or etched into the integrated circuit. The interconnects may serve to transmit different electronic signals including DC voltages and high frequency signals throughout the integrated circuit. Due to the small size of the interconnects and their close proximity to one another, their physical dimensions significantly affect their electrical properties. These affects become more pronounced when the interconnects are used to transmit high frequency signals.

Fabricating a very large quantity of such integrated circuits may be relatively inexpensive. However, the individual costs of fabricating a small number of complex integrated circuits tends to be very expensive. Furthermore, changing the design of an integrated circuit is very expensive and time consuming. Accordingly, it tends to be very expensive and time consuming to fabricate a small number of integrated circuits for testing, then change their design and fabricate a second small number of integrated circuits for further testing.

In order to reduce the cost of designing and redesigning integrated circuits, the integrated circuits can be simulated by a computer program. This simulation may involve entering the physical characteristics of the interconnects along with the components of the integrated circuit into a computer program. The computer program may then simulate and analyze the integrated circuit. If the integrated circuit needs to be modified and retested, it may be done simply by editing the computer program.

The computer program may take a long time to accurately analyze a complex integrated circuit. For example, many integrated circuits operate at high frequencies. Thus, the electrical properties, such as inductance and capacitance, associated with each interconnect becomes very relevant. In order to accurately analyze the circuit, each interconnect may have to be analyzed in great detail. When the computer program analyzes each interconnect in great detail, the time required to run the analysis increases significantly.

SUMMARY

A method of analyzing a circuit comprising a plurality of interconnects is disclosed herein. The method may comprise calculating at least one electrical property associated with a first interconnect, wherein the first interconnect has at least one first physical dimension. The calculated electrical property may then be stored. A second interconnect having the at least one first physical dimension may then be located and the at least one electrical property is applied to the second interconnect.

BRIEF DESCRIPTION OF THE DRAWINGS

FIG. 4 is an example of a data base that stores RLC parameters corresponding to various interconnects.

DETAILED DESCRIPTION

Figure 1:
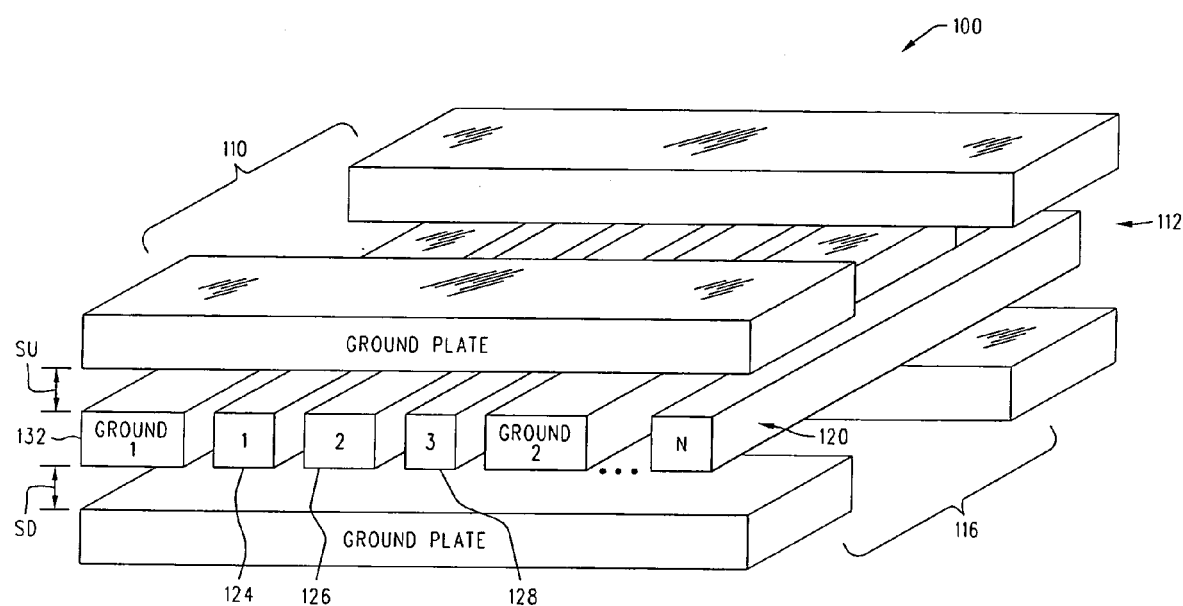
FIG. 1 is an embodiment of a portion of a multilayered integrated circuit having several interconnections.

An embodiment of an integrated circuit 100 is shown in FIG. 1. The integrated circuit 100 is sometimes referred to herein simply as the circuit 100. It should be noted that the circuit 100 may be a small portion of a much larger circuit that is not shown. As described in greater detail below, the circuit 100 is a multilayered circuit. In the embodiment of the circuit 100 shown in FIG. 1, only three layers are shown. These layers are a first metal layer 110, an interconnect layer 112, and a second metal layer 116. Both the first metal layer 110 and the second metal layer 116 may be ground plates or ground planes. Accordingly, both the first metal layer 110 and the second metal layer 116 may be at the same potential during operation. In other embodiments of the circuit 100, the first metal layer 110 and the second metal layer 116 may be at different potentials. The first metal layer 110 is separated from the interconnect layer 112 by a distance SU. The second metal layer 116 is separated from the interconnect layer 112 by a distance SD.

The interconnect layer 112 includes a plurality of interconnects 120. In the embodiment of the circuit 100 described herein, there are N number of interconnects, wherein N is an integer. An interconnect as used herein is a conductor or the like. An example of an interconnect is a conductor that may transmit data signals or voltages throughout the circuit 100. The interconnect layer 112 includes three interconnects 120, which are referred to individually as a first interconnect 124, a second interconnect 126, and a third interconnect 128. Methods and devices for analyzing the electrical characteristics of the circuit 100, including the interconnects 120, are described in greater detail below. In addition to the above described interconnects, the embodiment of the interconnect layer 112 described herein also includes a first ground conductor 132 and a second ground conductor 134.

Figure 2:
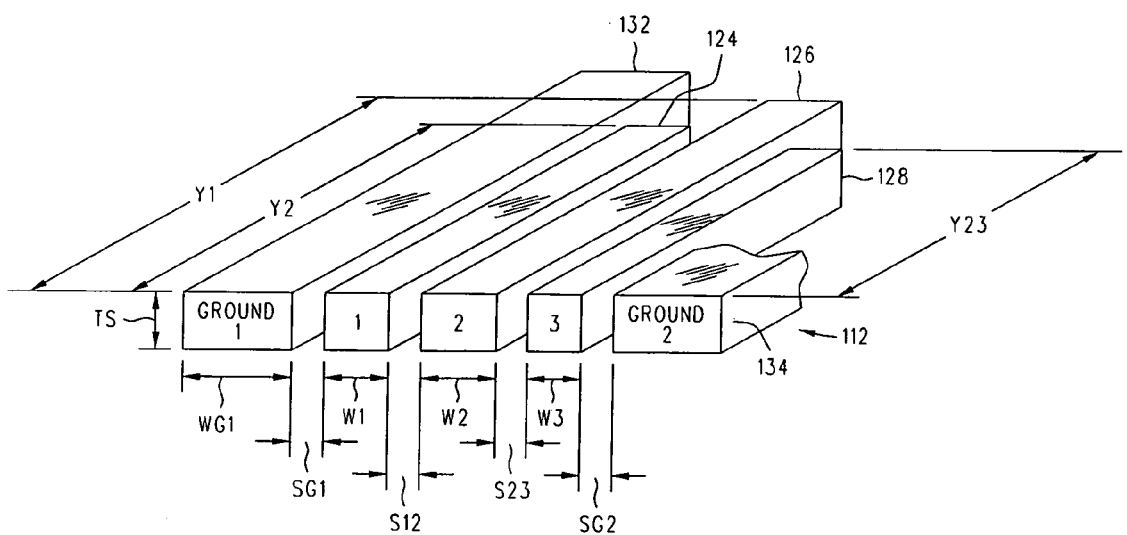
FIG. 2 is an embodiment of the interconnect layer of the integrated circuit of FIG. 1.

A more detailed view of the interconnect layer 112 is shown in FIG. 2. The dimensions of the interconnects 120, the first ground conductor 132, and the second ground conductor 134 in the interconnect layer 112 are shown in FIG. 2. As shown, all the interconnects 120 along with the first ground conductor 132 and the second ground conductor 134 have a height TS. The first ground conductor 132 has a width WG1. The first interconnect 124 has a width W1, the second interconnect 126 has a width W2, and the third interconnect 128 has a width W3. The first interconnect 124 has a length Y1, the second interconnect 126 has a length Y2, and the third interconnect 128 has a length Y3. The first ground conductor 132 is separated from the first interconnect 124 by a distance SG1. The first interconnect 124 is separated from the second interconnect 126 by a distance S12. The second interconnect 126 is separated from the third interconnect 128 by a distance S23. The third interconnect 128 is separated from the second ground conductor by a distance SG2.

For illustration purposes, the dimensions of the first interconnect 124 and the third interconnect 128 are substantially similar. In addition, for illustration purposes, the distance SG1 is substantially similar to the distance SG2 and the distance S12 is substantially similar to the distance S23.

Referring again to FIG. 1, other components and layers may be included in the circuit 100. For illustration purposes, these other components and layers are not shown or described in detail herein. For example, the circuit may have several metal layers and several layers containing conductors, such as interconnects. The circuit 100 may also contain thousands of electronic components or have thousands electronic components etched therein. Accordingly, the circuit may have thousands or even millions of interconnects.

Having described the physical layout of the circuit 100, methods and devices for analyzing the circuit 100 will now be described in detail.

The circuit 100 may be analyzed by performing a computer simulation on the circuit 100. The portion of the analysis described herein will focus solely on the interconnects 120. More specifically, the portion of the analysis described herein focuses on simulating the interconnects 120. It is to be understood that the entire analysis of the circuit 100 may also include simulations of the above-described electronic components.

As stated, the analysis may be performed by a computer executing software or a computer program. Accordingly, the methods described herein may be implemented by way of the computer program. Various embodiments of the program and computer are described in greater detail further below.

In summary, the portion of the analysis described herein performs analyses on a first interconnect to yield at least one electrical property associated with the first interconnect. The electrical properties are based on the physical dimensions of the interconnect. The electrical properties and the corresponding physical dimensions of the interconnect are stored in a data base. As the analysis of the circuit continues, different interconnects may be analyzed and their electrical properties may be stored in the data base. If the circuit analysis needs to analyze a second interconnect with physical dimension equivalent or substantially similar to the first interconnect that has already been analyzed, the circuit analysis program downloads the electrical properties from the data base rather than performing the same analysis over again. These electrical properties are then applied to the analysis involving the second interconnect. By downloading the electrical properties, the circuit analysis program is able to execute faster than it would had it calculated the electrical properties for each interconnect.

Figure 3:
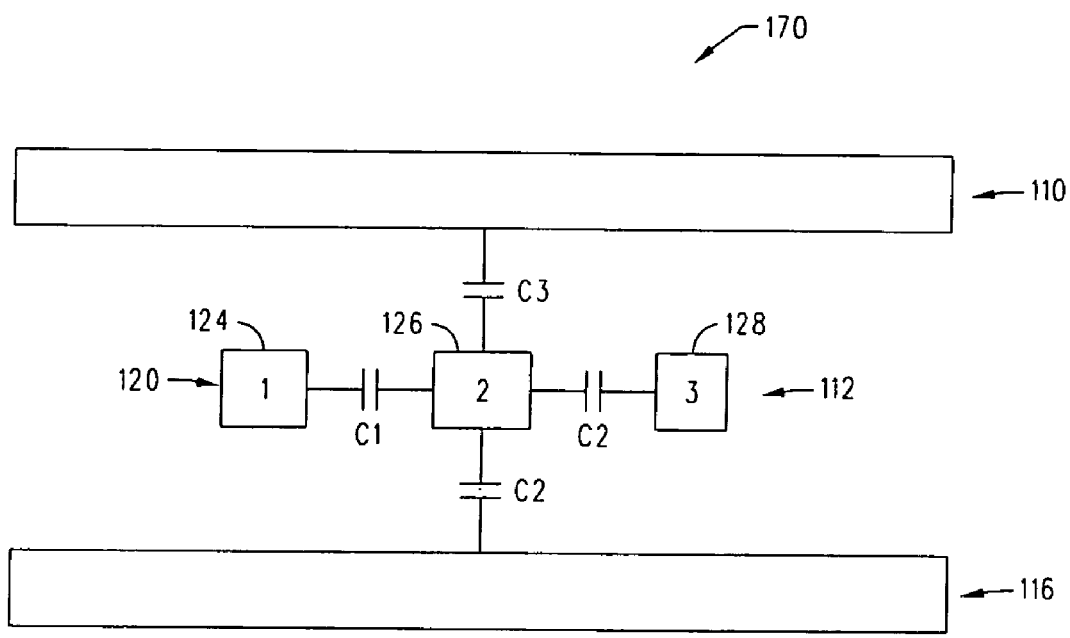
FIG. 3 is an example of a circuit that simulates an interconnect of FIGS. 1 and 2.

For illustration purposes, an example of analyzing the electrical properties of the second interconnect 126 will be described. It should be noted that the following description is applicable to many of the other interconnects that may be located in the circuit 100. FIG. 3 is an embodiment of the capacitance associated with the second interconnect 126. With additional reference to FIG. 2, the analysis program may calculate the capacitances associated with the second interconnect 126. The capacitances associated with the second interconnect 126 may be substantially dependent on the physical characteristics or dimensions of the second interconnect 126. The capacitances may also be dependent on the physical characteristics of the second interconnect in relation to other conductors and interconnects located proximate the second interconnect 126.

In the embodiment of FIG. 3, four capacitances associated with the second interconnect 126 will be calculated. In other embodiments of the methods and computer programs, more or less capacitances may be analyzed. The capacitances that will be analyzed are a first capacitance C1, a second capacitance C2, a third capacitance C3, and a fourth capacitance C4. The first capacitance C1 is the capacitance between the first interconnect 124 and the second interconnect 126. The second capacitance C2 is the capacitance between the second interconnect 126 and the third interconnect 128. The third capacitance C3 is the capacitance between the second interconnect 126 and the first metal layer 110. The fourth capacitance C4 is the capacitance between the second interconnect 126 and the second metal layer 116.

The first capacitance C1, in addition to the other capacitances, depends on many physical characteristics associated with the second interconnect 126. It should be noted that the methods described herein do not disclose all the possible physical characteristics and dimensions that may be analyzed in order to calculate capacitance. More or less physical characteristics and dimensions of the interconnects 120 may be analyzed depending on the required accuracy of the capacitance calculations.

In the present embodiment, the capacitance C1 is proportional to the areas of the portions of the first interconnect 124 and the second interconnect 126 that face each other in addition to the distance S12 between the interconnects 124, 126. Therefore, the capacitance C1 is proportional to the length Y1, the length Y2, the height TS, and the distance S12. The capacitance C2 is proportional to the length Y2, the length Y3, the height TS, and the distance S23. With additional reference to FIG. 1, the third capacitance C3 is proportional to the width W2, the length Y2, and the distance SU. The fourth capacitance C4 is proportional to the width W2, the length Y2, and the distance SD. Other variables, such as dielectric constants of materials used in the circuit 100 may also affect the capacitance calculations.

Some of the above-described physical dimensions may also be used to calculate the inductance and resistance associated with the second interconnect 126 and the other interconnects. For example, the resistance of the second interconnect is proportional to the width W2 multiplied by the height TS and divided by the length Y2. The inductance of the second interconnect is also proportional to many of the above-described physical dimensions.

The electrical properties calculated above may be used to represent the second interconnect 126 along with the other interconnects as simple resistor-inductor-capacitor (RLC) equivalent circuits. The equivalent RLC circuits reduce the time required to analyze the interconnects 120. They may also reduce the processing requirements of the computer that is analyzing the interconnects 120. More specifically, the equivalent circuits are less complex and easier to analyze than the interconnects.

The above-described electrical properties may be stored in a data base as illustrated in FIG. 4. The data base, as an example, may be a parasitic data base. As shown in FIG. 4, the data base may store height, length, width, and other parameters related to different types of interconnects. The other parameters depend on the accuracy to which the RLC equivalent circuits are evaluated. For example, the data base may store the distance between the interconnects or the distance between the interconnects and the conductive or metal layers 110, 116, FIG. 1. In the embodiment of FIG. 4, the physical parameters have been designated as letters. For example, a first type of interconnect has a height A, a length B, a width C, and some other parameters that may be designated by D. The resulting equivalent RLC circuit for this type of interconnect is designated as X. A second type of interconnect has a height A, a length B, a width E, and the other parameters are designated by D. The resulting equivalent RLC circuit for this type of interconnect is designated as Y. A third type of interconnect has a height A, a length B, a width F, and other parameters designated by D. The resulting equivalent RLC circuit for this type of interconnect is designated as Z.

During the analysis of a circuit, other interconnects may be analyzed. If an interconnect has physical dimensions equal to or similar to the physical dimensions of an interconnect that has been analyzed, the previously calculated electrical properties may be applied to the new interconnect. For example, the program may have analyzed the three types of interconnects of FIG. 4 and calculated RLC equivalent circuits or other electrical properties. When a new interconnect is analyzed, its physical dimensions are compared to those of interconnects that have been analyzed. If the physical dimensions of the new interconnect are the same as the dimensions of an interconnect that has been previously analyzed, the electrical properties of the previously analyzed interconnect are applied to the new interconnect.

The process of applying previously calculated electrical properties to interconnects may be illustrated by the circuit 100 of FIG. 1. As described above, the physical dimensions of the first interconnect 124 are substantially similar or equal to the physical dimensions of the third interconnect 128. In addition the proximity of both the first interconnect 124 and the third interconnect 128 to the second interconnect 126 and the metal layers 110 and 116 are similar. Thus, the analysis program may calculate the electrical properties of the first interconnect 124 and store them in a database. Rather than recalculate the electrical properties of the third interconnect 128, the analysis program may download them based on the electrical properties calculated for the first interconnect 124. Therefore, the time required to analyze the circuit 100 is reduced.

In another embodiment, the electrical properties of a previously analyzed interconnect that has physical dimensions similar to a new interconnect are applied to the new interconnect. For example, if the new interconnect has physical dimensions that are within a preselected range of the physical dimensions of the first type of interconnect, the previously calculated RLC circuit may be applied to the new interconnect. This embodiment may cause some degradation in the circuit analysis, however, the speed at which the analysis is accomplished may be significantly increased. As described below, another embodiment of the program may perform interpolation in order to obtain more accurate results.

Figure 5:
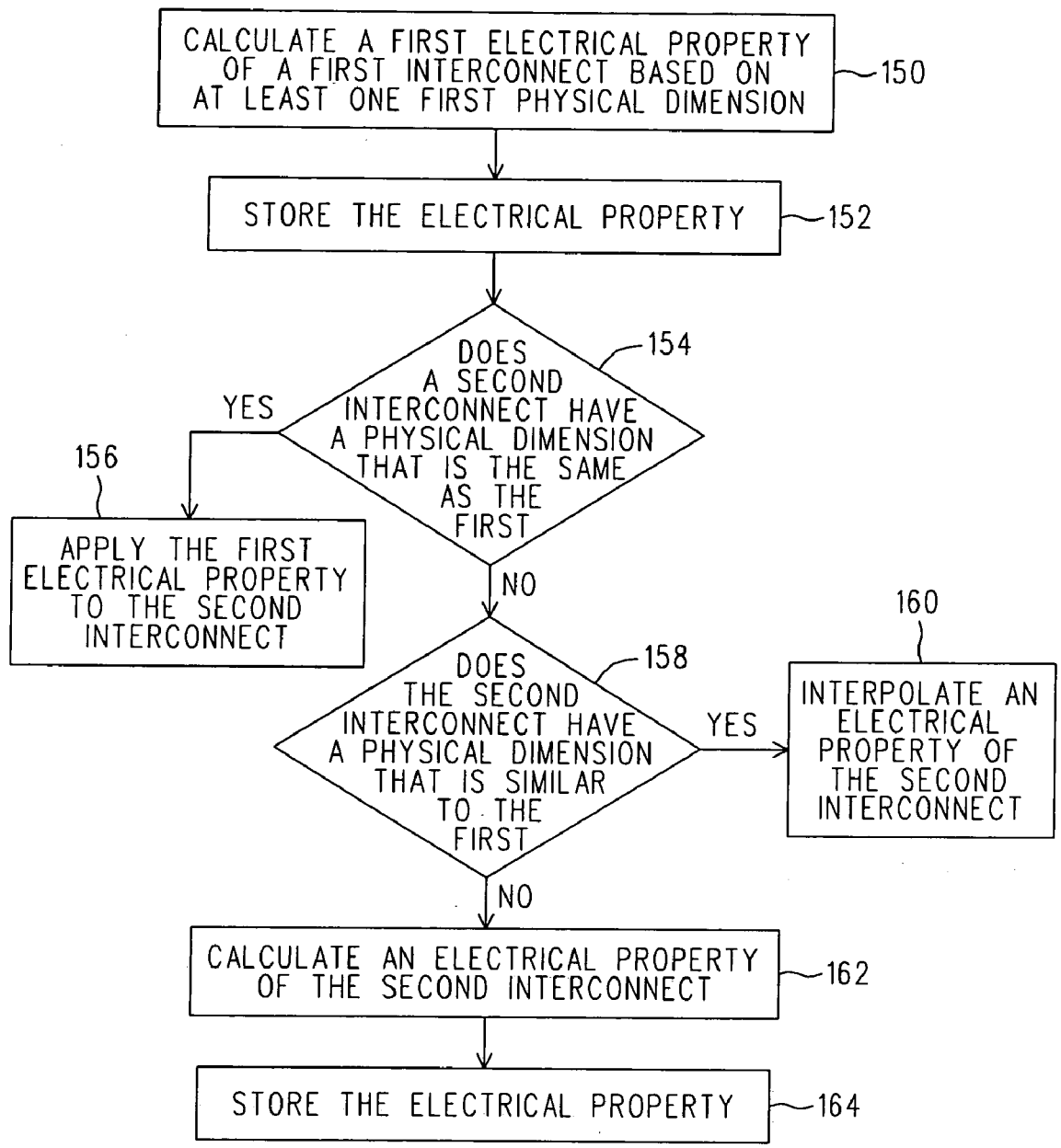
FIG. 5 is a flow chart of an embodiment of analyzing the circuit of FIG. 1.

A more elaborate analysis program is illustrated by the flow chart of FIG. 5 and provides for matching physical dimensions to new interconnects in addition to interpolation. At step 150, an electrical property of a first interconnect is calculated based on at least one first physical dimension. At step 152, the first electrical property is stored. A database as described with reference to FIG. 4 may be used to store the physical dimensions and the electrical properties of the interconnects. For example, the database may be a parasitic database. At step 154, a second interconnect is analyzed to determine whether it has physical dimensions that are the same as the first interconnect. If the physical dimensions of the interconnects are the same, the electrical properties calculated for the first interconnect are applied to the second interconnect as shown at step 156.

If the physical dimensions of the interconnects are not the same as set forth at step 154, an analysis is performed at step 158 to determine whether the physical dimensions are similar. The similarity between the interconnects serves as a basis to determine whether electrical properties of the second interconnect can be interpolated based on the first interconnect. The similarities of the physical dimensions required to interpolate the electrical properties of the second interconnect may be preselected by a user. If the physical dimensions are similar enough to provide for interpolation, the electrical properties of the second interconnect are interpolated as shown at step 160.

If the physical dimensions of the interconnects are not similar enough to perform interpolation as set forth at step 158, the electrical properties of the second interconnect are calculated as they were for the first interconnect and as shown at step 162. The electrical properties of these interconnects are then stored as shown at step 164. The physical dimensions of a third interconnect that is to be analyzed may then be compared to both the first interconnect and the second interconnect. Accordingly, at steps 154 and 156, the physical dimensions of the third interconnect may be compared to both the first interconnect and the second interconnect. As the electrical properties of more interconnects are calculated, the physical dimensions of these additional interconnects may be compared to the physical dimensions of new interconnects as described above.

As briefly described above, various computer programs may be used to analyze the circuit 100. These computer programs are readable or executable code or electronically executable instructions that may be implemented in any suitable manner, such as software, firmware, hard-wired electronic circuits, or as the programming in a gate array, etc. Software may be programmed in any programming language, such as machine language, assembly language, or high-level languages such as C or C++. The computer programs may be interpreted or compiled.

Computer readable or executable code or electronically executable instructions may be tangibly embodied on any computer-readable storage medium or in any electronic circuitry for use by or in connection with any instruction-executing device, such as a general purpose processor, software emulator, application-specific circuit, a circuit made of logic gates, etc. that can access or embody, and execute, the code or instructions.

Methods described and claimed herein may be performed by the execution of computer readable or executable code or electronically executable instructions, tangibly embodied on any computer-readable storage medium or in any electronic circuitry as described above.

A storage medium for tangibly embodying computer readable or executable code or electronically executable instructions includes any means that can store, transmit, communicate, or in any way propagate the code or instructions for use by or in connection with the instruction-executing device. For example, the storage medium may include (but is not limited to) any electronic, magnetic, optical, or other storage device, or any transmission medium such as an electrical conductor, an electromagnetic, optical, infrared transmission, etc. The storage medium may even comprise an electronic circuit, with the code or instructions represented by the design of the electronic circuit. Specific examples include magnetic or optical disks, both fixed and removable, semiconductor memory devices such as memory cards and read-only memories (ROMs), including programmable and erasable ROMs, non-volatile memories (NVMs), optical fibers, etc. Storage media for tangibly embodying code or instructions also include printed media such as computer printouts on paper which may be optically scanned to retrieve the code or instructions, which may in turn be parsed, compiled, assembled, stored and executed by an instruction-executing device. The code or instructions may also be tangibly embodied as an electrical signal in a transmission medium such as the Internet or other types of networks, both wired and wireless.

What is claimed is:

1. A method of analyzing a circuit comprising a plurality of interconnects, said method comprising:
    calculating at least one electrical property associated with a first interconnect, said first interconnect having at least one first physical dimension;
    storing said at least one electrical property;
    locating a second interconnect having said at least one first physical dimension; and
    applying said at least one electrical property to said second interconnect.

2. The method of claim 1, wherein said at least one electrical property is capacitance.

3. The method of claim 1, wherein said at least one electrical property is inductance.

4. The method of claim 1, wherein said at least one electrical property is resistance.

5. The method of claim 1, wherein said storing comprises storing said at least one electrical property in a parasitic data base.

6. A method of analyzing a circuit comprising a plurality of interconnects, said method comprising:
    calculating at least one first electrical property associated with a first interconnect, said first interconnect having at least one first physical dimension;
    storing said at least one first electrical property;
    locating a second interconnect having at least one second physical dimension that corresponds to said at least one first physical dimension; and
    interpolating at least one second electrical property related to said second interconnect based on said at least one first physical dimension, said at least one second physical dimension, and said at least one electrical property.

7. The method of claim 6, wherein said at least one first electrical property is capacitance.

8. The method of claim 6, wherein said at least one first electrical property is inductance.

9. The method of claim 6, wherein said at least one first electrical property is resistance.

10. The method of claim 6, wherein said storing comprises storing said at least one first electrical property in a parasitic data base.

11. A method of analyzing a circuit comprising a plurality of interconnects, said method comprising:
    calculating at least one electrical property associated with a first interconnect, said first interconnect having at least one first physical dimension;
    storing said at least one electrical property;
    locating a second interconnect having said at least one second physical dimension that corresponds to said at least one first physical dimension, the value of said at least one second physical dimension being within a preselected amount of the value of said at least one first physical dimension; and
    applying said at least one electrical property to said second interconnect.

12. The method of claim 11, wherein said at least one first electrical property is capacitance.

13. The method of claim 11, wherein said at least one first electrical property is inductance.

14. The method of claim 11, wherein said at least one first electrical property is resistance.

15. An apparatus for analyzing a circuit comprising a plurality of interconnects, said apparatus comprising:
    at least one computer readable medium; and
    computer readable program code stored on said at least one computer readable medium, said computer readable program code comprising:
        program code for calculating at least one electrical property associated with a first interconnect, said first interconnect having at least one first physical dimension;
        program code for storing said at least one electrical property; and
        program code for applying said at least one electrical property to a second interconnect comprising at least one second physical dimension that is similar to said at least one first physical dimension.

16. An apparatus for analyzing a circuit comprising a plurality of interconnects, said apparatus comprising:
    at least one computer readable medium; and
    computer readable program code stored on said at least one computer readable medium, said computer readable program code comprising:
        program code for calculating at least one first electrical property associated with a first interconnect, said first interconnect having at least one first physical dimension;
        program code for storing said at least one first electrical property; and
        program code for interpolating at least one second electrical property related to a second interconnect, said interpolating based on said at least one first physical dimension, said at least one second physical dimension, and said at least one electrical property.

17. The apparatus of claim 16, wherein said at least one first electrical property is capacitance.

18. The apparatus of claim 16, wherein said at least one first electrical property is inductance.

19. The apparatus of claim 16, wherein said at least one first electrical property is resistance.

20. The apparatus of claim 16, wherein said storing comprises storing said at least one first electrical property in a parasitic data base.

21. An apparatus for analyzing a circuit comprising a plurality of interconnects, said apparatus comprising:
    calculating means for calculating at least one electrical property associated with a first interconnect in a circuit, wherein said first interconnect has at least one first physical dimension;
    storing means for storing said at least one electrical property; and
    means for applying said at least one electrical property to a second interconnect having a physical dimension similar to said at least one first physical dimension.

* * * * *